(12) United States Patent
Schwartz et al.

(10) Patent No.: US 7,879,456 B2
(45) Date of Patent: *Feb. 1, 2011

(54) CARRIER APPLIED COATING LAYERS

(76) Inventors: Jeffrey Schwartz, 55 Locust La., Princeton, NJ (US) 08540; Michael J. Avaltroni, 152 Dalton Ave., Staten Island, NY (US) 10306-2117; Michael P. Danahy, 223A King St., Princeton, NJ (US) 08540; Brett M. Silverman, 3H Magie Apartments, Princeton, NJ (US) 08540

( * ) Notice: Subject to any disclaimer, the term of this patent is extended or adjusted under 35 U.S.C. 154(b) by 0 days.

This patent is subject to a terminal disclaimer.

(21) Appl. No.: 12/169,324

(22) Filed: Jul. 8, 2008

(65) Prior Publication Data

US 2009/0004481 A1    Jan. 1, 2009

Related U.S. Application Data

(63) Continuation of application No. 10/876,294, filed on Jun. 23, 2004, now Pat. No. 7,396,594, which is a continuation-in-part of application No. 10/179,743, filed on Jun. 24, 2002, now Pat. No. 7,569,285, which is a continuation-in-part of application No. 09/668,080, filed on Sep. 22, 2000, now Pat. No. 6,645,644, which is a continuation-in-part of application No. 08/794,833, filed on Feb. 4, 1997, now Pat. No. 6,146,767, said application No. 10/876,294 is a continuation-in-part of application No. 10/405,557, filed on Apr. 1, 2003, now Pat. No. 7,507,483, and a continuation-in-part of application No. 10/179,743, filed on Jun. 24, 2002, now Pat. No. 7,569,285.

(60) Provisional application No. 60/480,670, filed on Jun. 23, 2003, provisional application No. 60/300,144, filed on Jun. 22, 2001, provisional application No. 60/155,398, filed on Sep. 22, 1999, provisional application No. 60/028,949, filed on Oct. 17, 1996, provisional application No. 60/035,040, filed on Jan. 13, 1997, provisional application No. 60/369,236, filed on Apr. 1, 2002, provisional application No. 60/369,237, filed on Apr. 1, 2002.

(51) Int. Cl.
B32B 15/04 (2006.01)
B44C 1/17 (2006.01)

(52) U.S. Cl. .............. 428/632; 428/701; 428/702; 428/704; 428/428; 428/472.2; 428/469; 428/472; 428/472.1; 428/472.3; 156/230; 156/236

(58) Field of Classification Search .............. None
See application file for complete search history.

(56) References Cited

U.S. PATENT DOCUMENTS

| | | | |
|---|---|---|---|
| 3,634,146 A * | 1/1972 | Wystrach et al. ............ 428/470 |
| 3,772,355 A | 11/1973 | Merz | |
| 4,184,213 A * | 1/1980 | Heimke .................... 623/23.61 |
| 4,403,941 A | 9/1983 | Okiura et al. | |
| 4,668,968 A * | 5/1987 | Ovshinsky et al. ............ 257/61 |
| 4,788,176 A | 11/1988 | Wieserman et al. | |
| 4,830,993 A | 5/1989 | Legrand et al. | |
| 4,909,846 A | 3/1990 | Barfurth et al. | |
| 4,929,589 A | 5/1990 | Martin et al. | |
| 4,962,073 A | 10/1990 | Martin et al. | |
| 4,994,429 A * | 2/1991 | Wieserman et al. ......... 502/401 |
| 5,032,237 A * | 7/1991 | Wieserman et al. ......... 205/188 |
| 5,102,507 A | 4/1992 | Wieserman et al. | |
| 5,103,550 A * | 4/1992 | Wefers et al. ............... 29/527.4 |
| 5,126,210 A * | 6/1992 | Wieserman et al. ......... 428/469 |
| 5,185,208 A | 2/1993 | Yamashita et al. | |
| 5,231,151 A | 7/1993 | Spencer et al. | |
| 5,277,788 A | 1/1994 | Nitowski et al. | |
| 5,279,720 A | 1/1994 | Divigalpitiya | |
| 5,286,571 A | 2/1994 | Mirkin et al. | |

(Continued)

FOREIGN PATENT DOCUMENTS

JP      2018463      1/1989

(Continued)

OTHER PUBLICATIONS

Miller et al., "The Importance of Liquid Kinetic Basicity on the Preparation of Surface Supported Zirconium Complexes by Proton Transfer from Hydroxylated Aluminum on Silicon", J. Am. Chem. Soc., 115, 8239-8247 (1993).

(Continued)

Primary Examiner—Aaron Austin
(74) Attorney, Agent, or Firm—Fox Rothschild LLP; Peter J. Butch, III

(57) ABSTRACT

Methods for bonding adherent phosphorous-containing coating layers to oxide surfaces on substrates wherein the substrates with oxide surfaces are selected from:

(a) oxidized iron, titanium, silicon, tin and vanadium;
(b) indium tin oxide; and
(c) substrates with oxide layers deposited thereon, wherein the substrates on which oxide layers are deposited are selected from ceramics, semiconductors, metals, plastics and glass, and the method contacts the oxide surface with a carrier conveying an organo-phosphonic acid coating composition and heats the oxide surface and carrier at a sufficient temperature while maintaining contact for a sufficient time to bond a layer of the organophosphonic acid to the oxide surface. Coated articles prepared by the inventive method are also disclosed.

29 Claims, No Drawings

U.S. PATENT DOCUMENTS

| | | | |
|---|---|---|---|
| 5,397,642 A | 3/1995 | Li et al. | |
| 5,463,804 A | 11/1995 | McCleary et al. | |
| 5,767,032 A | 6/1998 | Hokkanen et al. | |
| 6,020,047 A | 2/2000 | Everhart | |
| 6,030,710 A | 2/2000 | Nitowski et al. | |
| 6,167,609 B1 * | 1/2001 | Marinelli et al. | 29/469.5 |
| 6,433,359 B1 * | 8/2002 | Kelley et al. | 257/40 |
| 6,436,475 B1 | 8/2002 | Adler et al. | |
| 6,824,882 B2 | 11/2004 | Boardman et al. | |
| 7,090,496 B2 | 8/2006 | Descouts et al. | |
| 7,396,594 B2 * | 7/2008 | Schwartz et al. | 428/626 |
| 7,517,546 B2 * | 4/2009 | Hofer et al. | 427/2.11 |
| 2003/0186914 A1 | 10/2003 | Hofer et al. | |
| 2004/0049287 A1 | 3/2004 | Descouts et al. | |
| 2004/0054422 A1 | 3/2004 | Descouts et al. | |
| 2008/0166470 A1 * | 7/2008 | Schwartz et al. | 427/2.27 |

FOREIGN PATENT DOCUMENTS

| | | |
|---|---|---|
| JP | 5224448 | 9/1993 |

OTHER PUBLICATIONS

Gagliardi et al., Pre-Resonance Raman Characterization of Metal-Organic Films From Titanium Alkoxide Carboxylate Compleses, Mat. Res. Soc. Syp. Proc. 180, 801-805 (1990).

Laibimis et al., "Orthogonal Self0Assembled Mono-Layers: Alkanethiols on Gold and Alkane Carboxylic Acids on Alumina", Science, 245, 845 (1989).

Gao et al., "Self-Assembled Monolayers of Alkylphosphonic Acids on Metal Oxides", Langmuir, 12, 6429-6435 (1996).

Fang et al., "XPS, AES and Raman Studies of an Antitarnish Film on Tin", Corrosion, 47(3), 169-173 (1991).

Strivastava, Characterization of Adhesive Bonded Lap Joints of C/C-SiC Composite and Ti-6A1-4V Alloy Under Varying Conditions, Intl. J. Adhesion and Adhesives, 23, 59-67 (2003).

Seto, "Stabilization of Self-Assembled Monolayers on Native Oxides", Thesis No. 6066, Available Princeton University Library System on Oct. 17, 1995.

Gawalt et al., "Enhanced Bonding of Alkanephosphonic Acids to Oxidized Titanium Using Surface-Bound Alkoxyzirconium Complex Interfaces", Langmuir-The ACS Journal of Surfaces and Colloids, vol. 15, No. 26, pp. 8929-8933.

* cited by examiner

CARRIER APPLIED COATING LAYERS

CROSS-REFERENCE TO RELATED APPLICATIONS

The present application is a Continuation of U.S. application Ser. No. 10/876,294 filed Jun. 23, 2004, which issued as U.S. Pat. No. 7,396,594 on Jul. 8, 2006, and which claims priority benefit under 35 U.S.C. §119(e) of U.S. Provisional Application Ser. No. 60/480,670 filed Jun. 23, 2003. U.S. application Ser. No. 10/876,294 is also a continuation-in-part of U.S. patent application Ser. No. 10/179,743 filed Jun. 24, 2002, which claims priority benefit under 35 U.S.C. §119(e) of U.S. Provisional Application No. 60/300,144 filed Jun. 22, 2001. U.S. patent application Ser. No. 10/179,743 is also a continuation-in-part of U.S. application Ser. No. 09/668,080 filed Sep. 22, 2000, which claims priority under 35 U.S.C. §119(e) of U.S. Provisional Patent Application Ser. No. 60/155,398 filed Sep. 22, 1999. U.S. application Ser. No. 09/668,080 is also a continuation-in-part of U.S. application Ser. No. 08/794,833 filed Feb. 4, 1997, which application in turn claims priority benefit under 35 U.S.C §119(e) of U.S. Provisional Patent Application Ser. No. 60/028,949 filed Oct. 17, 1996 and 60/035,040 filed Jan. 13, 1997.

U.S. application Ser. No. 10/876,294 is also a continuation-in-part of U.S. patent application Ser. No. 10/405,557 filed Apr. 1, 2003, which claims priority benefit under 35 U.S.C. §119(e) of U.S. Provisional Patent Application Nos. 60/369,236 and 60/369,237, both of which were filed Apr. 1, 2002. U.S. patent application Ser. No. 10/405,557 is also a continuation-in-part of the above-referenced U.S. patent application Ser. No. 10/179,743.

The disclosures of all of the above-described prior applications are incorporated herein by reference.

FIELD OF THE INVENTION

The present application relates to the provision of an adherent, self-assembled, phosphorous acid-based coating on an oxide surface, both as a coating layer for the surface and as an interface between the oxide surface and overlaying layers. Although the present application is illustrated below with the provision of an interface in improving the bond of an overlaying adhesive layer and in the provision of a patterned osteoconductive layer, it will be appreciated that the method of the present invention and the adherent, phosphorous acid-based coating layers provided thereby have much broader applicability.

BACKGROUND

The provision of an organic layer which is bonded to the surface of a substrate having insulating, metallic, conductive, or electronic properties is essential in building up devices for use as an interface between inorganic materials and organic or biological materials. Examples of interfaces using a biological/inorganic material interface are materials for in vivo implant, for example, bone ingrowth-promoting orthopedic implants and implantable biosensors that utilize a bioactive layer to detect a chemical or biological species. In such biosensor devices, a biologically active layer (also referred to herein as an bioactive layer) is coupled to a semi-conductor layer to generate an electronic or optical signal proportional to the amount or concentration of the species detected. Devices utilizing an organic/inorganic material interface are, for example, organic-based transistors (OT's) and light emitting diodes (OLED's).

The mechanical, chemical, and electronic properties of the interface between an organic or bioactive layer and an inorganic substrate depend upon many factors, not the least of which are: (a) the organization of the molecular moieties comprising the layer, for example, their alignment and attachment to the substrate's surface; and (b) the area specific density of bonds between the surface of the substrate and the organic layer. Additionally, the interface must display chemically stability and be robust under the conditions of use or it will deteriorate in use.

As described in copending U.S. application Ser. No. 10/701,591, filed Nov. 4, 2003, Ser. No. 10/405,557, filed Apr. 1, 2003, and Ser. No. 10/179,743, filed Jun. 24, 2002, each of which is incorporated herein by reference in their entirety, and as described in U.S. Pat. No. 6,433,359 to Kelley et al., it is known that a phosphorous acid can be used to provide a layer which adheres to an oxide surface. In general, the approach to providing layers utilizing acids of this type has been to treat the surface directly by spinning on, painting on or immersing (also termed herein "dip coating") a coating composition comprising the acid. These methods typically provide poorly organized coatings, or require equipment and techniques which do not readily lend themselves to substrates which are larger than a disc or which require that the coating be applied in a pattern.

Accordingly, the inventors have recognized the need for the provision of coatings which have an improved degree of organization and/or improved adhesion strength and/or which can be applied to surfaces over a large area, particularly when the coating is to be applied in a pattern.

SUMMARY OF INVENTION

The present invention meets these needs. The inventors have surprisingly found that a carrier furnished with a phosphorous acid can be used in the application of an adherent, phosphorous-based coating layer to an oxide surface. Accordingly, one aspect of the present invention is the provision of a method for forming an adherent phosphorous acid-based coating layer bonded to an oxide surface, said method comprising contacting said oxide surface with a carrier conveying a coating composition comprising an acid selected from the group consisting of phosphoric acids, organo-phosphoric acids, and phosphonic acids, and mixtures thereof, said contact being carried out at a sufficient temperature and for a sufficient time to bond at least a portion of said acid to said oxide surface.

In some preferred embodiments the carrier conveys the coating composition to the oxide surface by a process comprising: (a) contacting said carrier with a solution comprising one or more of said acids in a solvent; (b) removing said carrier from said contact; and (c) placing at least a portion of said carrier in contact with said oxide surface. In some preferred embodiments the carrier conveys the coating composition to the oxide surface in the form of a pattern, thereby providing a phosphorous acid-based coating layer on said oxide surface in substantially similar pattern.

In another aspect of the present invention the coating solution comprises at least one acid having an omega carbon substituent selected independently for each occurrence from the group consisting of carboxylic acid, phosphonic acid, hydroxyl, amino, and thiol, and the method of providing a phosphorous acid-based coating layer further comprises: (a) contacting at least a portion of said coating layer with a reagent capable of a bond-forming reaction with said omega-substituents; and (b) forming a bond between at least a portion of said contacting reagent and at least a portion of said omega-carbon substituents. In some preferred embodiments, the reagent which is capable of a bond-forming reaction with said omega-carbon substituents is contacted to the coating layer in a printing medium, more preferably, is patterned on the coating layer using a printing technique.

In some preferred embodiments, the acid in the coating composition is selected from phosphoric acid and phosphonic acids. In some preferred embodiments the coating composition comprises a phosphonic acid having an organic ligand selected independently for each occurrence from the group consisting of: (a) linear or branched, saturated or unsaturated hydrocarbon moieties having from about 2 to about 40 carbon atoms which optionally includes an aromatic segment are optionally substituted on any carbon thereof with one or more functional groups; (b) oligoarene and polyarene moieties which are optionally substituted on any carbon thereof with one or more functional groups; and (c) substituted and unsubstituted TCNQ and TTF derivatives.

In some preferred embodiments the carrier comprises a hydrophilic material. In some preferred embodiments the carrier is a porous or reticulated material, more preferably, a woven material, and even more preferably, comprises cotton fiber. In some preferred embodiments the oxide surface is selected from the group consisting of native oxides on metals, ceramics, semiconductors, and insulators, more preferably the oxide surface is selected from: (a) native oxides on titanium, steels, iron, silicon, aluminum, and the alloys of each of these, ceramics, and semiconductors; (b) an insulating oxide deposited on a substrate, more preferably a dielectric layer in an electronic device; and (c) a conducting oxide deposited on a substrate, more preferably indium tin oxide on glass.

Another aspect of the invention is a method for providing improved adhesion between an adhesive coating applied to an oxide surface and the oxide surface comprising providing a phosphorous acid-based layer in at least a portion of the interface between the oxide layer and the adhesive coating. Preferably, the phosphorous acid-based layer is formed on the oxide surface by contacting a carrier conveying at least one phosphorous acid to the oxide surface under temperature conditions sufficient to form on at least a portion of said contacted oxide surface an adherent, phosphorous acid-based coating layer. In some preferred embodiments the phosphorous acid species from which said coating layer is formed is an omega-functionalized phosphoric acid species and the adhesive layer applied comprises a polymer layer formed from a reactive polymerizing organic species which reacts with at least a portion of the omega functional groups of said phosphorous acid-based coating layer, thereby bonding at least a portion of said coating layer to at least a portion of said adhesive polymer layer.

Another aspect of the invention is the provision of an adherent phosphorous acid-based coating layer on the surface of an oxide using any of the above-described coating methods.

DETAILED DESCRIPTION

The methods of the present invention provide an adherent, phosphorous acid-based coating layer bonded to an oxide surface of a material. These coating layers have utility in derivitizing the oxide surface to alter the properties of the surface. For example, the chemical properties of the surface, for example, the affinity of the surface for hydrophilic or lipophilic substances may be altered in this manner. In addition, the electrical properties, for example, the ability of the surface to carry out charge carrier injection processes can be altered in this manner. While the methods and coating layer of the present invention have broad utility in providing a chemically derivatizated coating layer on oxide surfaces, it is anticipated that the present invention will be most useful in the provision of phosphorous acid-based coatings which act as interface between the oxide surface and overlayer adhered thereto, thereby improving or facilitating the adherence of said overlayer to the oxide surface. Examples of such uses include improvement in the adhesion of an adhesive for a metal oxide surface, for example, an epoxy adhesive layer bonded to the native oxide surface of a titanium alloy, and the provision of a osteoadhesive layer in a medical implant in living bone tissue. Although the method of the present invention has broad applicability in providing a phosphorous acid-based adherent coating layer to an oxide surface, it is anticipated that the method of the present invention will be most useful in the provision of an adherent phosphorous acid-based coating layer on the oxide surface of metals, semiconductors, and insulators. Examples of oxide surfaces include, but are not limited to, oxide surfaces which form spontaneously (native oxides) as well as those applied to a surface, for example by sputtering. In particular it is anticipated the method will find greatest utility in the provision of a phosphorous-based coating layer on oxides of traditionally low reactivity, for example, the native oxide surface of titanium alloys Finally, although the method and coating layer of the present invention has broad applicability in providing an adherent phosphorous acid-based coating layer on oxide surfaces on a wide scale of sizes, it is anticipated that the present invention will find its greatest utility in the provision of coating layers in operations wherein coating is done in a continuous operation, for example, by lamination of a carrier furnished with a phosphorous acid and a carrier of material comprising the oxide surface to which the coating layer is applied.

The Method

Without wanting to be bound by or to any particular theory, as described in copending U.S. application Ser. No. 10/701,591, filed Nov. 4, 2003, Ser. No. 10/405,557, filed Apr. 1, 2003 and Ser. No. 10/179,743, filed Jun. 24, 2002, each of which is incorporated herein by reference in their entirety, it is believed that when a phosphorous acid is contacted to an oxide surface for a sufficient period of time under suitable temperature conditions, there is formed a bond between the acid functional group and the oxide surface. Surprisingly the inventors have discovered that adherent phosphorous coating layers can be prepared utilizing a carrier to convey a coating composition comprising one or more phosphorous acids to the oxide surface to be coated. Without being bound by or to any particular theory, it is believed that by selecting the hydrophillic properties of the carrier to be compatible with the phosphorous acid used to provide the coating the method of the present invention provides a coating layer with improved order and improved bonding of multi-layer character over methods utilizing "dip" coating, as described for example in the above-mentioned copending U.S. application Ser. No. 10/179,743. This improvement in layer organization and bonding provides improved coverage of the surface, improved adhesion of the coating layer, and increases the chemical and electronic communication between the coating layer and the surface.

In addition, the method of the present invention is believed to provide improvement in the efficiency of applying a coating of the invention to a large surface area in comparison to dip-on or paint-on methods. It will be appreciated that the method of the present invention is readily adaptable to a continuous coating operation using a web or belt system to provide a coating of the invention to a continuous supply of oxide surface. The method of the present invention also provides a convenient method of placing a coating on an oxide surface in a pattern which has here-to-fore only been possible by masking portions of the surface to be coated prior to providing the coating. Accordingly the method of the present invention provides for a reduction in the unit operations necessarily required to prepare a patterned phosphorus acid-based coating layer on an oxide surface.

The method of the present invention comprises contacting a carrier conveying a coating composition comprising a phosphorous acid to an oxide surface for a sufficient duration and under temperature conditions sufficient to form bonds between at least a portion of the furnished phosphorous acid and the contacted oxide surface. No particular environmental conditions are required to provide a coating layer on an oxide surface by the present invention method, although if it is desired the present invention can be carried out within environmental chambers or under inert atmospheres.

It will be appreciated that the carrier may be in many different forms, for example, a roller, pad, sheet, roll, web, or belt. Other forms will be apparent. It will also be appreciated that the method of contacting the carrier to the oxide surface will vary depending upon the phosphorous acid(s) comprising the coating solution, the concentration, the temperature conditions, and the nature and character of the oxide surface to be coated.

In keeping with the principles set forth herein, examples of the various methods which may be used to contact the carrier to the oxide surface include fashioning the carrier into a roller which is rolled across the oxide surface, fashioning it into a stamp or plate which is contacted to the oxide surface either manually or by mechanical means, furnishing a roll of the carrier with the coating solution which is unrolled onto the oxide surface, laminating a web or belt of carrier material which has been furnished with the coating solution to a supply of the oxide surface. It will be appreciated that when the oxide surface permits it to be presented as a web, belt, or sheet, for example, acrylic and polyethylene oxide terphthalate PET which has been coated with silicon dioxide, a continuous lamination process can be used. It will also be appreciated that when the oxide surface is in a more or less rigid form, for example, an indium tin oxide coating on glass, a feeding mechanism accompanying a belt, chain, or web-feed type of lamination equipment can be adapted to laminate sections of the oxide surface with a continuous belt or web of the carrier. It will be appreciated that many other modifications exist in the coating, printing and laminating arts which can be adapted to contact both flexible and rigid carrier materials with oxide surfaces residing on either flexible or rigid substrates.

The duration of the contact between the carrier and the oxide surface will depend upon the coating solution selected, the oxide surface, and the temperature conditions obtaining during contact. For example, for some oxide surfaces, for example, the native metal oxide on aluminum, and for some acids, for example, hydroxyundecylphosphonic acid, the coating layer will form spontaneously at any ambient temperatures, for example about 20° C., and above. Typically for short contact times, for example, about 5 minutes or less, contact is made under temperature conditions of from at least about 100° C. up to about 200° C. If lower temperatures are employed, or for different oxide surfaces and phosphorous acids, longer contact times, for example several hours, may be required. One of ordinary skill can easily determine the duration of contact required at a particular temperature to form a satisfactory coating by placing a coupon of carrier which has been furnished with the intended coating solution in contact with a coupon containing a sample of the oxide surface to be coated into an oven maintaining the intended contact temperature for varying times and measuring the amount of phosphorous acid-based coating formed on the oxide surface. Other methods of determining the minimum necessary contact time at a particular temperature for a particular coating solution and oxide surface will be apparent.

Typically, contact times employed in the method of the present invention are from about 1 minute to about 20 minutes at temperatures from ambient, about 20° C. to about 200° C. More preferably, contact times from about 5 minutes to about 20 minutes are employed at temperatures from about 50° C. to about 200° C.

It will be appreciated that when heating is required to drive the coating reaction numerous arrangements may be employed to provide the heat to the contacted carrier and oxide surface. These include, but are not limited to, applying a heated body to the distal side of the carrier while the proximal side of the carrier is in contact with the oxide surface, contacting the carrier and oxide surface within a heated zone, for example, within an oven, and contacting the carrier and oxide surface and trans-porting them in contact into a heated zone. In the latter example, the oxide surface and carrier can be in the form of a sheet which is transported through an oven or furnace on a belt or in a batch conveyance. Alternatively, the oxide surface and carrier can be in the form of a two webs which are contacted and passed in contact through a heated zone, as for example, will be familiar to those of skill in the laminating arts. In another non-limiting example, heat to drive the coating reaction can be provided by heating the oxide surface separately and bringing the carrier into contact with the heated oxide surface thereafter.

The process of conveying the coating composition to the oxide surface requires furnishing the coating composition to the carrier. This can be accomplished by contacting the carrier with a coating solution, removing the carrier from contact with the coating solution, and contacting the carrier with the oxide surface. The coating solution comprises the phosphorous acid to be used in forming the coating and a solvent, for example, an alcohol. In some preferred processes, between the step of removing the carrier from contact with the coating solution and the step of contacting the carrier conveying the coating to the oxide surface, an evaporation step is conducted during which a portion, preferably a substantial portion, of the solvent conveyed by the carrier from the coating solution is evaporated. In some preferred embodiments, after the drying step the carrier appears to be "dry" when visually inspected, and can be handled, transported, and packaged without exuding any solvent. In some embodiments the carrier provided with the coating composition in this manner will be employed to provide a coating on an oxide surface remote in time and/or location from the time and place in which the coating composition was provided to the carrier. It will be appreciated that other methods of providing the coating composition to the carrier can be employed.

Without wanting to be bound by or to any particular theory, it is thought that the evaporation step improves the organization of the coating composition on the carrier prior to contacting the carrier to the oxide surface.

The Carrier

As indicated above, the carrier of the present invention can comprise numerous flexible and rigid materials. In general the carrier is selected to have some affinity, for example, hydrogen bonding or Van-der-waals interaction, for the phosphorous acid(s) comprising the coating solution, but not to react with them. Without being bound by or to any particular theory, it is believed that in selecting the carrier to exhibit an affinity for the phosphorous acid(s) comprising the coating solution the carrier imposes some order on the acid moieties therein prior to contacting the surface, and thereby presents the phosphorous acid from which the coating is derived to the oxide surface as a collection of moieties having at least short range ordering, and thereby providing a coating layer which has imparted to it at least localized ordering of the coating moieties. Again without wanting to be bound by or to any particular theory, it is believed that this is similar to the organizational effect in amphiphile films at an air/water interface.

Accordingly in some embodiments, preferred carriers are those which have non-reactive surface hydroxyl groups with which the phosphorous acid(s) comprising the coating solution can form hydrogen bonding. Examples of this include cellulose materials, for example, cotton fiber. Guided by these general principles it will be apparent that materials having surfaces which have been derivatized to have greater or lesser hydrophilic nature can also be employed. It will be appreciated this includes surfaces comprising materials which, for example, fibers have regions comprising various alcohol, ether, ester, amino, amido and like moieties. It will also be appreciated this includes both materials in which this type of functionality is either naturally occurring or in which the functionality has been introduced by chemical derivatization of the materials. An example of one such naturally occurring material is cotton fiber and materials made therefrom. It will be appreciated that numerous surface modifications of numerous materials are possible to bond moieties containing functional groups which can "fine tune" the hydrophilic nature of the surface to maximize the organizational effect of the carrier for a particular coating solution.

It is contemplated that suitable carriers for the present method include those which have absorbent properties for the coating solution, adsorbent properties for the coating solution or both. Thus the carrier material can have for example, the form of a reticulated or porous material which provides interstices into which a coating solution can be take up by absorption. The carrier can also be non-porous, utilizing adsorptive properties, for example a material that has an affinity for the coating solution such that it is readily "wetted" by the coating solution. Suitable carrier materials will generally have a mixture of both types of properties. Accordingly it will be appreciated that for some applications, a non-porous, smooth carrier will be employed which relies on adsorption of the phosphorous acid comprising the coating solution to convey it to the oxide surface to be coated. In other applications, the carrier will be porous or reticulate and have absorptive properties for the coating solution.

Preferred carriers include cellulose materials having a hydrophilic surface, for example woven and non-woven cotton and woven and non-woven polymers which have hydrophilic surfaces. Rigid materials having hydrophilic materials which are non-reactive toward phosphorous acids are also preferred. It will be appreciated that surfaces which have been derivatized with a phosphorous acid which contains hydrophilic functional groups may also be employed.

The Coating Solution and Composition

As the term is used herein, the coating composition comprises the acid used in forming the coating layer of the invention organized on the carrier, some amount of the solvent retained from the coating solution, and optionally other constituents which may be added to improve the stability or handling characteristics of the coating solution, as are known in the art.

In general, coating compositions suitable for use in the present invention method comprise an acid selected from the group consisting of phosphoric, organophosphoric, and phosphonic acids and a solvent. In some preferred embodiments the solvent is water or an alcohol. Particularly preferred are phosphonic acids and alcohol solvents, particularly ethanol. In general, coating compositions employ dilute solutions of the acid, typically in the millimolar (mM) concentration range. In some embodiments the coating compositions are prepared from solutions having an acid concentration of from about 0.01 mM to about 5.0 mM, more preferably from about 0.1 mM to about 3.0 mM. However, in accordance with known principles and the chemical stability of the carrier materials and oxide surface used in the process the concentration of the solution may be adjusted to higher or lower values.

The Acid

As used herein, the phrase "phosphorous acid" refers to phosphoric acid ($H_3PO_4$), organo-phosphoric ($R^1$—O—$PO_3H_2$), wherein $R^1$ is an organic moiety bonded to the phosphorous atom through an oxygen atom, and phosphonic acid compounds having the formula R—$PO_3H_2$ wherein R is an organic ligand, that is wherein a carbon atom is directly bonded to phosphorus. In general, the organic moiety in organophosphoric acids can be selected from the same organic moieties described below for the phosphonic acid organic ligand, guided by general chemical principles regarding the stability of the phosphorate species after bonding to an oxide surface. Any of the acid species which are disclosed for preparing coatings in any of co-pending U.S. application Ser. No. 10/701,591 filed Nov. 4, 2003, Ser. No. 10/405,557 filed Apr. 1, 2003 and Ser. No. 10/179,743 filed Jun. 24, 2002, each of which is incorporated herein by reference in their entirety, may be employed in the methods of the present invention to prepare the coatings of the present invention.

The preferred acids for use in the present invention are phosphonic acids. Preferred phosphonic acids have an organic ligand selected from the group of organic moieties consisting of aliphatic and aromatic hydrocarbon moieties having from about 2 to about 40 carbon atoms, and more preferably from about 2 to about 20 carbon atoms. However, the present invention contemplates organic moieties having an amount of carbon atoms lying outside of this range as the properties desired of the coating formed dictate larger or smaller organic moieties.

Suitable aliphatic organic moieties may be linear or branched, saturated or unsaturated, and may be optionally substituted with one or more functional groups, including aromatic substituents. Aromatic organic moieties may comprise arene structures, for example a monomeric, oligomeric, or polymeric arene structure, for example anthracene and pentacene, which are directly bonded to a phosphate moiety. Alternatively, aromatic moieties may be bonded to a phosphate moiety through an intervening aliphatic moiety. Aromatic moieties may optionally be substituted on any carbon with one or more functional groups.

In some preferred embodiments the ligands are selected from organic moieties which are based on organic compounds having electron donor and acceptor properties, for example, moieties which are based on derivatives of the art recognized electron acceptor and donor molecules TCNQ and TTF, the structures of which are well known. As is known, TCNQ and TTF are typically used as building blocks in the provision of organic conductors. As described in detail in copending U.S. application Ser. No. 10/701,591 filed Nov. 4, 2003, which is incorporated herein by reference, substituted molecular derivatives of TCNQ with altered electron acceptor properties are also known and have been described, for example, by Yamashita et al. in Journal of Materials Chemistry, (1998), 8(9), 1933-1944, which is incorporated herein in its entirety by reference. Moieties based on the TCNQ derivatives are also preferred ligands in phosphorous acids employed in coating solutions for the present development.

Known also and described in detail in co-pending U.S. patent application Ser. No. 10/701,591, filed Nov. 4, 2003, which is incorporated herein by reference, are TTF derivative compounds with altered electron donating properties. Such molecules have been described, for example, by Hasegawa et al. in Synthetic Metals (1997), 86, pages 1801-1802, which is incorporated herein in its entirety also by reference. As has been described, TTF can be substituted, with electron donating groups to enhance its electron-donor properties. Moieties based on these TTF derivatives are also preferred as ligands for phosphorous acids used in coating solutions for the present invention.

Substituents on the hydrocarbon ligand of phosphonic acids useful in the present invention may be appended to any carbon atom of the hydrocarbon ligand. Useful substituents are, for example, those which may influence the hydrophilicity and/or lipophilicity of a coating prepared therefrom, for example, alkyl groups, and reactive functional groups, for example those selected from the group consisting of hydroxyl, carboxylic acid group, amino, a thiol, a sulfonic acid group, a phosphonic acid group and chemical derivatives thereof. It will be appreciated that any functional group which can participate in a further derivatization reaction can be employed. Additionally, suitable hydrocarbon ligands may contain within their structure or appended to their structure, reactive moieties, for example sites of unsaturation, which may be further reacted in a polymerization reaction with reactive substituents on the hydrocarbon ligands appended to other phosphonate sites bound to the surface of the oxide during a phosphonate derivatizing reaction. Additionally, reactive functional groups may be included on one or more carbon atoms of the organic ligand of the acid used to form the coating. These functional groups may be employed to further derivatize the coating layer formed as explained in detail below and in each of copending U.S. application Ser. No. 10/701,591, filed Nov. 4, 2003; Ser. No. 10/405,557, filed Apr. 1, 2003 and Ser. No. 10/179,743, filed Jun. 24, 2002, each of which is incorporated herein by reference in their entirety.

In a particularly preferred embodiment, coatings are formed from phosphonic acids having an organic ligand functionalized at the omega-carbon of the ligand. In general, when omega-functionalized phosphonic acids are used to form the coating layers of the invention, after reaction of the acid to the oxide surface, the resultant phosphonic acid film generally comprises phosphonate moieties bonded to the oxide surface with the omega-carbon directed away from the surface and available for covalent bonding or further chemical modification. Preferred omega-functional groups include hydroxyl, amino, carboxylate and thiol groups.

Another class of substituents which may advantageously be bonded to a phosphonic acid organic ligand are pi-electron delocalized moieties. Particularly useful compounds are pi-electron delocalized aromatic ring compounds (oligo- and polyarene ligands). Five-membered heteroaromatic ring compounds having phosphonic acid ring substituents are also desirable because of their high degree of pielectron delocalization. Examples of such rings include furan, thiophene and pyrrole.

The Oxide Surface

As explained in detail in each of co-pending U.S. application Ser. No. 10/701,591, filed Nov. 4, 2003; Ser. No. 10/405, 557, filed Apr. 1, 2003; and Ser. No. 10/179,743, filed Jun. 24, 2002, each of which is incorporated herein by reference in their entirety, a coating layer comprising a phosphorous acid in accordance with the present invention can be formed on both native oxide surfaces and oxide surfaces which are deposited on a substrate or formed on an existing oxide surface. Accordingly, non-limiting examples of native oxide surfaces upon which a phosphorous acid-based film can be formed include materials which have metallic, conducting, semiconducting, and insulating properties, as those terms are defined, for example, by A. West in Basic Solid State Chemistry, second edition, John Wiley & Sons, New York, pp. 110-120, which is incorporated herein in its entirety by reference. Examples of substrates suitable for use in the process of the invention include, but are not limited to, materials which possess a native oxide surface, that is they comprise an oxide or form a native oxide upon exposure to the ambient environment. Non-limiting examples of oxide materials include bulk metal oxides, for example silica and alumina, oxides deposited on a substrate, for example, conducting oxides, for example, indium doped tin oxide and zinc/indium doped tin oxide each deposited on a glass substrate, and oxide insulators, for example, low dielectric constant glass in gate insulator material of integrated circuits and metal oxide deposid on plastic substrates, for example "stacked" metal oxide on PET plastic (which has a top layer of silicon dioxide), for example anti reflective plastic obtained commercially from Berkaert Specialty Films.

Non-limiting examples of materials which form native metal oxide surfaces upon exposure to the ambient include steels, including stainless steels, iron, and metals which acquire a non-ablating oxide coating upon exposure to the ambient environment, for example, titanium, titanium alloys, aluminum, and aluminium alloys. Additional examples of materials which acquire a native oxide layer upon exposure to the ambient are ceramic materials, for example silicon nitride and semiconductors, for example silicon. Also suitable for application of a coating of the present invention are materials that have an oxide coating imparted to them intentionally, for example, thick film oxide insulators in semiconducting devices, and those which can be derivatized to have an oxide surface, for example, gallium arsenide, gallium nitride, and silicon carbide. Also suitable for use in the provision of a coating layer of the present invention are naked surfaces which can undergo hydrolysis and which have an adsorption affinity for phosphonic acid functional groups, for example, silicon nitride.

Particularly preferred substrates are those which are useful in preparing electronic devices and those useful for mechanical devices for contact with biological tissue or fluids. An example of those useful for the preparation of electronic devices are thick oxide insulating layers on gate junctions for use in bio-electronic sensors which are suitable for in vivo and in vitro diagnosis and monitoring of conditions. An additional example is indium tin oxide conducting oxide deposited on glass. An example of a surface useful in the preparation of mechanical devices is an implantable material, for example, a titanium reinforcing member useful for in vivo implant in the repair of bone tissue.

As mentioned above, suitable surfaces include the surfaces of semiconductor substrates, for example silicon single crystal surfaces. They include also the surfaces of polycrystalline substrates, for example, metals, for example titanium and its alloys, aluminium and its alloys and silicon. Also included are surfaces of amorphous substrates, for example, the surface of an oxide conductor or oxide insulator. Examples of conductive oxides include $Fe_3O_4$, tin oxide doped to conduction with indium and/or zinc, zinc oxide doped to conduction with aluminium, zinc oxide, and sub-stoichiometric oxides, for example, TiO and V.

Also preferred are ceramic substrates, for example, silicon nitride and silicon carbide, and semiconductors, for example germanium and semiconducting germanium-based compounds.

In general, an oxide surface is prepared prior to contact with the carrier by cleaning the surface to remove residual metals and organics, generally by an oxidation treatment followed by a water rinse. Oxide surfaces that are stable toward such treatment, for example, a single crystal or polycrystalline silicon wafer surface, the surface may be treated with the standard hydrogen peroxide/sulfuric acid "piranha" solution followed by a water rinse and a second treatment with a standard hydrogen peroxide/hydrochloric acid "buzzard" solution, in the manner typically followed for cleaning silicon wafers prior to fabricating integrated circuits on the wafer. In general, the process of the invention affords best results on oxide surfaces which are devoid of free base species, zero-valent metals and residual hydrocarbon species. However, even for surfaces which do not lend themselves to a rigorous cleaning to semiconductor standards, for example, conducting oxides, the process of the invention will still provide a coating layer which has good adhesion to the oxide surface upon which the coating layer is formed. Other cleaning methods applicable to particular surfaces for the removal of the unwanted species typical of those surfaces will be apparent to those of skill in the art.

Derivitizing the Phosphorous Acid-Based Coating Layer

As described above and in explained in detail in each of copending U.S. application Ser. No. 10/701,591, filed Nov. 4, 2003; Ser. No. 10/405,557, filed Apr. 1, 2003; and Ser. No. 10/179,743, filed Jun. 24, 2002, each of which is incorporated herein by reference in its entirety, when a phosphorous acid-based coating layer of the invention is prepared from a coating composition comprising a di- or polyfunctional phosphorous acid, for example an omega-functionalized phosphonic acid, the coating layer formed can be further derivatized with additional reagents. Nonlimiting examples of such reagents include derivatizing the omega hydroxyl groups of a coating layer formed from an omega-hydroxy phosphonic acid with a protein coupling reagent and incorporating the hydroxyl groups of such a coating layer into an epoxy adhesive layer applied on top of the coating layer. Examples of protein coupling reagents include maleimido and succinimidoyl coupling reagents. As described in the above-mentioned copending applications, and as will be appreciated, guided by the requirements for the coating layer and general chemical principals, numerous other derivatizing reactions can be carried out that utilize the reactive species available in the coating layer prepared using a phosphorous acids which includes one or more reactive substituents.

Such reactions can be employed to provide a pattern of the derivatized species on the surface of a coating layer provided by the present invention. For example, the above-described protein coupling reagent incorporated into a printing medium can be applied in a pattern to a coating layer prepared by the process of the invention utilizing a printing technique. Non-limiting examples of this include providing the coupling reagent in a medium suitable for delivery from an ink-jet printing device. When such patterns of derivatizing reagents are applied they can find utility in biosensor devices and in providing engineered biological structures for example, which can be utilized in implantable devices. It will be appreciated that other non-impact and impact printing techniques, for example, lithography, screen printing, stamping, and gravure printing can be adapted to provide patterns of derivatizing reagents on coating layers of the invention.

Patterning Oxide Surfaces

In accordance with the above described principles and methods, the coating process of the present invention can be used to provide a coating layer which is in a pattern on the oxide surface. Thus, a coating composition can be provided to the carrier in a pattern which will be transferred to the oxide surface when the carrier is contacted to an oxide surface under temperature conditions suitable to form a bond between the oxide surface and the coating composition. It will be appreciated that numerous means can be used to provide a pattern of coating composition on the carrier. Non-limiting examples include spraying a coating solution onto the carrier in only pre-determined areas, for example, by ink-jet printing and stencilling. Other methods may be found by adapting printing techniques, including stamping, lithographing, and gravure printing a coating solution onto the carrier in a pattern.

In the same manner, the carrier itself can be provided in the form of a pattern, for example, a stencil or a stamp. In this manner, when an coating composition is conveyed to an oxide surface the pattern of the carrier will transfer the coating composition to an oxide surface in a like pattern.

It will also be appreciated that when the carrier conveying a coating composition is in a form suitable for mechanical manipulation, for example, in the form of a roller or ball, it can be mechanically directed in a pattern across an oxide surface to provide a coating layer having a pattern reflecting the path along which it was directed on the surface.

There follows an example of utilizing a carrier comprising a cotton pad to apply a coating of the present invention to the native oxide surface of a titanium coupon and to an oxide surface comprising silicon dioxide deposited on a flexible plastic sheet. The following examples are intended to illustrate the process of the invention and the films formed thereby and are not meant to limit the scope of the invention. It will be appreciated that there are many modifications possible to the materials and process steps exemplified below which still fall within the scope of the inventive process and films.

EXAMPLES

For the following examples, ethanol (reagent grade) was obtained from Aldrich Chemical and used as received. 11-Hydroxyundecylphosphonic acid (a linear, 11 carbon atom difunctional phosphonic acid having an omega hydroxyl functional group to the phosphonic acid) was synthesized according to published procedures. Disks were cut from titanium Ti-6Al-4V rod (1" in diameter, obtained from Goodfellow, Inc.) and prepared for use by sanding, followed by cleaning with methanol. The disks were dried for at least an hour before use, and stored in an oven at 200° C.

Samples were analyzed using either a Nicolet 730 FT-IR equipped with a Spectra Tech diffuse reflectance (DRIFT) attachment or a MIDAC Illuminator equipped with a Surface Optics specular reflectance head. When the Nicolet was used for analysis, infrared experiments were performed using a glancing angle attachment, a Variable Angle Specular Reflectance Model 500, obtained from Spectra Tech. The angle between the surface normal and the incident beam was approximately 87°. For both instruments, samples were purged with nitrogen for half an hour to reduce the amount of water on the surface, and 1,000 scans were collected to obtain a reasonable signal to noise ratio. All spectra obtained were as a ratio against a spectrum of a clean native oxide surface.

Example I

Application of a Coating Layer

A white cotton swatch of commercial textile measuring 2" square was prepared as a carrier by rinsing in distilled water and drying in air. A 1.0 millimolar coating solution of 11-Hydroxyundecylphosphonic acid was prepared by dissolving 0.1 mM of the acid in 100 ml of ethanol. About 50 ml of the solution was placed in a shallow dish and the carrier was placed in the solution and saturated with it. The carrier was then removed from the solution and permitted to remain in air until it was visibly dry (overnight). Thus prepared the carrier containing a coating composition comprising 11-Hydroxyundecylphosphonic acid was placed over a titanium disk prepared as described above. A consumer cloth iron with a Teflon® coated heating platen (Black & Decker) set for cotton cloth (no steam) was placed on top of the assembly for a period of 5 minutes. At the end of the heating period the iron was removed and the oxide substrate (titanium disk) was allowed to cool in the ambient air. The disks were sonicated in ethanol and rinsed with copious amounts of ethanol and dried in air.

Infrared examination of the area covered by the carrier by the procedure described above showed the presence of a coating layer comprising bound 11-Hydroxyundecylphosphonate. Integration of the signal strength indicated that the films comprised about 10 times the amount of material typically observed by treating similar surfaces directly with a similar coating solution. Repeated rinsing and sonication did not result in a diminution of the signal, indicating that the coating layer was well bound to the surface.

Visual inspection of the coupon shows that a coating layer is applied to the coupon only where contact was made with the carrier.

Example 2

Deposition of a Coating Layer on a Metal Oxide Coated Plastic

A sheet of antireflective coated polyethylene oxide terphthalate (PET) which has a top layer of silicon dioxide will be obtained from Bekaert Specialty Films. Application of a cotton carrier prepared with a coating composition, as described above for Example 1, in accordance with the treatment procedure described above for Example 1 will be found to provide an 11-Hydroxyundecylphosphonate coating to the antireflective coated plastic.

Example 3

Derivatization of the Surface with an Adhesive Layer

It will be found that the coating layer prepared in Example 1 above (a phosphonate coating derived from 11-Hydroxyundecyl phosphonic acid) can be further derivatized with an epoxy linking group by applying a film of Cytec Fiberite FM 1000® epoxy adhesive to the surface. Before the adhesive cured, a second titanium coupon prepared according to Example 1 can be placed in contact with the epoxy such that a lap joint is formed. When the epoxy is cured under ambient conditions, it will be found that the strength of the lap joint, when compared with substantially similar assemblies prepared from equivalent titanium coupons which have not received a coating layer by the process of the invention, is considerably lower. It will be found if these samples are compared according to ASTM testing standard F1044-99, on average the joint between the uncoated coupons failed at ⅔ the pressure which must be applied to fail the joint between the coated coupons.

What is claimed is:

1. A method of bonding an adherent phosphorous-containing coating layer to an oxide surface on a substrate, wherein said substrate with an oxide surface is selected from the group consisting of:
    (a) oxidized iron, titanium, silicon, tin and vanadium;
    (b) indium tin oxide; and
    (c) substrates with oxide layers deposited thereon, wherein said substrates on which said oxide layers are deposited are selected from the group consisting of ceramics, semiconductors, metals, plastics and glass,
said method comprising: (i) adsorbing or absorbing onto a hydrophilic carrier a solution comprising a coating composition comprising an organophosphonic acid compound, (ii) contacting said oxide surface with said carrier conveying said coating composition, and (iii) heating said oxide surface and carrier at a sufficient temperature while maintaining contact for a sufficient time to bond a layer of said organophosphonic acid compound to said oxide surface, wherein said adherent phosphorus-containing coating layer comprises said organophosphonic acid compound in an amount up to about 10 times greater than the amount in a coated article comprising the same substrate and oxide surface that is treated directly with said solution comprising said coating composition.

2. The method of claim 1, wherein said oxidized iron comprises oxidized steel.

3. The method of claim 2 wherein said oxidized steel is oxidized stainless steel.

4. The method of claim 1 wherein said oxide surface is an oxide layer deposited on a substrate.

5. The method of claim 4 wherein said substrate with an oxide surface layer comprises an oxide layer deposited on a substrate selected from the group consisting of gallium arsenide, gallium nitride, silicon carbide, silicon nitride, germanium and semiconducting compounds comprising germanium.

6. The method of claim 4 wherein said substrate with an oxide surface layer comprises an oxide insulator deposited on a substrate or an oxide conductor deposited on a substrate.

7. The method of claim 1 wherein said organophosphonic acid compound is a diphosphonic acid.

8. The method of claim 7, wherein said organophosphonic acid compound is 1,12-diphosphonododecane diphosphonic acid.

9. The method of claim 1, wherein said substrate is selected from the group consisting of plastics, glass, ceramic, semiconductors, and metals.

10. The method of claim 1, wherein the organo group of the organophosphonic acid compound is selected independently for each occurrence from the group consisting of: (a) optionally substituted linear and branched, saturated and unsaturated hydrocarbon moieties having from about 2 to about 40 carbon atoms; (b) optionally substituted oligoarene and polyarene moieties; and (c) substituted and unsubstituted tetracyanoquinodimethane and tetrathiofulvalene moieties.

11. The method of claim 1, wherein the organo group of the organophosphonic acid compound comprises functional groups selected independently for each occurrence from the group consisting of hydroxyl, amino, carboxylic acid, phosphonic acid, thiol, maleimido and succinimidoyl functional groups.

12. The method of claim 1 wherein the organo group of the organophosphonic acid compound is a linear alkyl group having at least one carbon chain of from about 2 to about 20 carbon atoms in length and an omega-substituent selected from the group consisting of hydroxyl, amino, carboxylic acid, phosphonic acid, thiol, maleimido and succinimidoyl functional groups.

13. The method of claim 1, wherein the organo group of the organophosphonic acid compound is selected independently for each occurrence from the group consisting of substituted and unsubstituted thiophene moieties, substituted and unsubstituted polythiophene moieties, substituted and unsubstituted oligomeric and polymeric arene moieties, organic electron donor moieties, organic electron acceptor moieties, tetracyanoquinodimethane moieties and tetrathiofulvalene moieties.

14. The method of claim 1, wherein the organo group of the organophosphonic acid compound comprises electronic conductor moieties.

15. The method of claim 14, wherein said electronic conductor moieties are selected from the group consisting of tetracyanoquinodimethane and tetrafluorotetracyanoquinodimethane.

16. The method of claim 1, wherein said coating composition comprises at least one organophosphonic acid compound having an omega-carbon substituent selected from the group consisting of carboxylic acid, phosphonic acid, hydroxyl, amino, and thiol functional groups, and the method further comprises: (a) contacting at least a portion of said coating layer with a reagent capable of a bond-forming reaction with said omega-carbon substituents; and (b) forming a bond between at least a portion of said contacting reagent and at least a portion of said omega-carbon substituents.

17. The method of claim 16, wherein said contacting step (a) is achieved by applying a printing medium containing said reagent to said coating layer.

18. The method of claim 17 wherein said printing medium is applied by a method selected from ink-jet printing, stamping, screen printing and lithography.

19. The method of claim 17 wherein said printing medium is applied in a pattern.

20. The method of claim 16, wherein at least a portion of said omega-functional groups are selected from the group consisting of carboxylic acid and hydroxyl functional groups and said reagent is a protein coupling reagent.

21. A coated article comprising a substrate with an oxide surface and an adherent phosphorus-containing coating layer bonded to said oxide surface, wherein said substrate with an oxide surface is selected from the group consisting of:

(a) oxidized iron, titanium, silicon, tin and vanadium;
(b) indium tin oxide; and
(c) substrates with oxide layers deposited thereon, wherein said substrates on which oxide layers are deposited are selected from the group consisting of ceramics, semiconductors, metals, plastics and glass, and said adherent phosphorus-containing coating layer bonded thereto is produced by a method comprising (i) adsorbing or absorbing onto a hydrophilic carrier a solution comprising a coating composition comprising an organophosphonic acid compound, (ii) contacting said oxide surface of said article with said carrier conveying said coating composition, and (iii) heating said oxide surface and said carrier at a sufficient temperature while maintaining contact for a sufficient time to bond said organophosphonic acid compound to said oxide surface, wherein said adherent phosphorus-containing coating layer comprises said organophosphonic acid compound in an amount up to about 10 times greater than the amount in a coated article comprising the same substrate and oxide surface that is treated directly with said solution comprising said coating composition.

22. The coated article of claim 21, wherein said oxidized iron comprises oxidized steel.

23. The coated article of claim 22 wherein said oxidized steel is oxidized stainless steel.

24. The coated article of claim 21, wherein said oxide surface is an oxide layer deposited on a substrate.

25. The coated article of claim 24, wherein said substrate with an oxide surface layer comprises an oxide layer deposited on a substrate selected from the group consisting of gallium arsenide, gallium nitride, silicon carbide, silicon nitride, germanium and semi-conducting compounds comprising germanium.

26. The coated article of claim 24, wherein said substrate with an oxide surface layer comprises an oxide insulator deposited on a substrate or an oxide conductor deposited on a substrate.

27. The coated article of claim 21, wherein the organo group of the organophosphonic acid compound comprises functional groups selected independently for each occurrence from the group consisting of hydroxyl, amino, carboxylic acid, phosphonic acid, thiol, maleimido and succinimidoyl functional groups.

28. The coated article of claim 21, wherein the organo group of the organophosphonic acid compound comprises electronic conductor moieties.

29. The coated article of claim 28 wherein said electronic conductor moieties are selected from the group consisting of tetracyanoquinodimethane and tetrafluorotetracyanoquinodimethane.

* * * * *

UNITED STATES PATENT AND TRADEMARK OFFICE
CERTIFICATE OF CORRECTION

| | | |
|---|---|---|
| PATENT NO. | : 7,879,456 B2 | Page 1 of 1 |
| APPLICATION NO. | : 12/169324 | |
| DATED | : February 1, 2011 | |
| INVENTOR(S) | : Jeffrey Schwartz et al. | |

It is certified that error appears in the above-identified patent and that said Letters Patent is hereby corrected as shown below:

In Column 1, Lines 35, please add the following paragraph:

GOVERNMENT SUPPORT CLAUSE

"This invention was made with government support under Grant No. 1 R21 RR14196 awarded by the National Institutes of Health. The government has certain rights in this invention."

Signed and Sealed this
Fifteenth Day of March, 2011

David J. Kappos
*Director of the United States Patent and Trademark Office*